United States Patent [19]

Chlestil

[11] 4,302,097

[45] Nov. 24, 1981

[54] THREE-DIMENSIONAL REPRESENTATION OF SOLID OBJECTS

[76] Inventor: Gustav Chlestil, Franz Grasslergasse 88, 1238 Wien, Austria

[21] Appl. No.: 148,228

[22] Filed: May 9, 1980

[30] Foreign Application Priority Data

May 11, 1979 [AT] Austria .................................. 3530/79

[51] Int. Cl.$^3$ ............................................. G03B 27/68
[52] U.S. Cl. ........................................ 355/52; 354/80; 355/77; 318/568; 352/86
[58] Field of Search ...................... 354/80; 355/52, 22, 355/77; 318/568; 352/43, 86

[56] References Cited

U.S. PATENT DOCUMENTS

| | | | |
|---|---|---|---|
| 2,721,989 | 10/1955 | Gates et al. | 318/568 |
| 2,996,348 | 8/1961 | Rosenberg | 318/568 |
| 3,302,209 | 1/1967 | Fengler | 318/568 |
| 3,373,267 | 3/1968 | Swann | 318/568 |
| 3,559,021 | 1/1971 | Bingham | 318/568 |
| 3,624,371 | 11/1971 | Neal et al. | 318/568 |
| 3,688,676 | 9/1972 | Cruickshank et al. | 355/52 |
| 4,158,487 | 6/1979 | Collender | 352/86 |
| 4,236,795 | 12/1980 | Kephart | 354/80 |

*Primary Examiner*—Monroe H. Hayes
*Attorney, Agent, or Firm*—Karl F. Ross

[57] ABSTRACT

A solid object, such as a human head, is optically scanned by photographically or photoelectrically recording, in each of a succession of closely spaced angular positions about a central axis, a group of three linear images to be subsequently used in a three-dimensional representation of the object. Each group includes the image of a silhouette of the object, taken along a line of sight perpendicular to the central axis, and two collateral images of contour lines projected upon the object in two planes on opposite sides of that line of sight intersecting approximately orthogonally along this axis. These images, or their stored data, serve to control the movement of carving tools such as a cutting wire and an end mill to sculpture a replica of the object from a block successively rotated into corresponding angular positions.

15 Claims, 17 Drawing Figures

THREE-DIMENSIONAL REPRESENTATION OF SOLID OBJECTS

FIELD OF THE INVENTION

My present invention relates to a method and an apparatus to be used in the three-dimensional representation of a solid object such as, for example, a human head.

BACKGROUND OF THE INVENTION

The technique of three-dimensionally reproducing such an object, e.g. in the form of a sculpture, with the aid of stored information has been known for some time. The information is generally obtained photographically, in the form of pictures taken of the object at different angles. In order to enable a faithful reproduction of the peaks and recesses of the object surface, it has already been proposed to project grids or contour lines upon that surface and to take images thereof in various relative positions of the object and a camera used for this purpose. Reference in this connection may be made, for example, to U.S. Pat. Nos. 2,015,457, 2,335,127 and 3,884,577. The last-mentioned patent teaches the projection of a horizontal luminous contour line at successive levels upon a human head to be replicated.

The scanning of an object surface with the aid of contour lines, however, does not invariably reveal all the detail required for high-fidelity reproduction. Human hair, especially when darkly colored, is a poor light reflector so that the shape of the top of the head, for example, is not always correctly reproduced with conventional techniques. Thus, it has often been necessary heretofore to reshape the automatically sculptured replica of a human head by manual retouching on the basis of additional photographs.

Artists have long practiced the reproduction of profiles of human heads in the form of silhouettes cut by scissors. Even a multiplicity of such silhouettes taken from various angles, however, will not encompass all the details needed for faithful three-dimensional representation and, in particular, will fail to reveal facial recesses characteristic of a person's physiognomy.

OBJECTS OF THE INVENTION

An important object of my present invention is to provide a method of storing information to enable high-fidelity three-dimensional representation of a solid object, such as a human head, without complicated and costly retouching opertions.

A related object is to provide a simple apparatus for carrying out this method.

It is also an object of my invention to provide a relatively simple apparatus designed for shaping a block of metal or other material to reproduce a solid three-dimensional object on the basis of information stored in this manner.

SUMMARY OF THE INVENTION

In accordance with an aspect of my present invention, the object to be three-dimensionally reproduced is positioned in front of an illuminated background area which substantially parallels an axis, referred to hereinafter as axis of rotation, passing through that object. Next, a silhouetted image of the object is taken against the illuminated background area in a direction generally perpendicular thereto. The object itself is illuminated, in the position referred to with a flat light beam trained upon it along a plane including the axis of rotation, which I shall term a lateral plane as distinct from a median plane bisecting the background area, whereby a contour line is projected upon the object surface. I prefer to use two such flat light beams disposed in a pair of lateral planes which intersect in the axis of rotation, with resulting projection of two contour lines upon the object surface. After a collateral image of the object showing the contour line or lines has been taken, at an acute angle to the lateral plane or planes, the foregoing steps are repeated in a multiplicity of different angular positions—centered on the axis of rotation—of the object relative to the aforementioned planes and to the background area. In each position the information conveyed by the silhouetted and collateral images are recorded, either on photographic film or on some other storage medium possibly including an electromagnetic or electronic memory.

An apparatus according to my invention, designed to carry out the described method, comprises a support rotatable about the axis defined by the intersections of the median and lateral planes referred to, this support carrying one or more screens defining at least one background area for the silhouetted images. The screen or screens are illuminated by first light-emitting means, carried on the support and shielded from a central space accommodating the object to be reproduced, while the contour line or lines are formed by second light-emitting means on the support which may be constituted by a projector (or preferably a pair of projectors) with a diaphragm having a slit parallel to the axis of rotation. I further provide light-guiding means, carried by the support, including at least one camera objective for focusing the silhouetted and collateral images upon a recording medium such as a photographic film or the cathode of a television camera working into a videotape. The light-guiding means on the support will generally also include one or more mirrors positioned to reflect light rays from the illuminated background area and from the object surface toward the camera objective or objectives.

Pursuant to a further aspect of my invention, an apparatus utilizing the stored data obtained from the silhouetted and collateral images comprises a rotatable support adapted to hold a workpiece or blank to be shaped into a replica of the object to be three-dimensionally reproduced. A first tool holder adjacent the workpiece support defines an operating line for a cutting edge skew to its axis of rotation, this operating line being tiltable about a fulcrum remote from that axis. A second tool holder adjacent the support defines a working plane including the axis of rotation for a cutting head pointed toward this axis. The prerecorded data are translated, with the aid of control means such as an image projector, into first positional information based on the silhouetted images for the guidance of the first tool holder and into second positional information based on the collateral images for the guidance of the second tool holder. The tool holders so guided operate alternately, in each of a multiplicity of angular support positions, on the blank to be shaped.

BRIEF DESCRIPTION OF THE DRAWING

The above and other features of my invention will now be described in detail with reference to the accompanying drawing in which.

SPECIFIC DESCRIPTION

Figure 1:
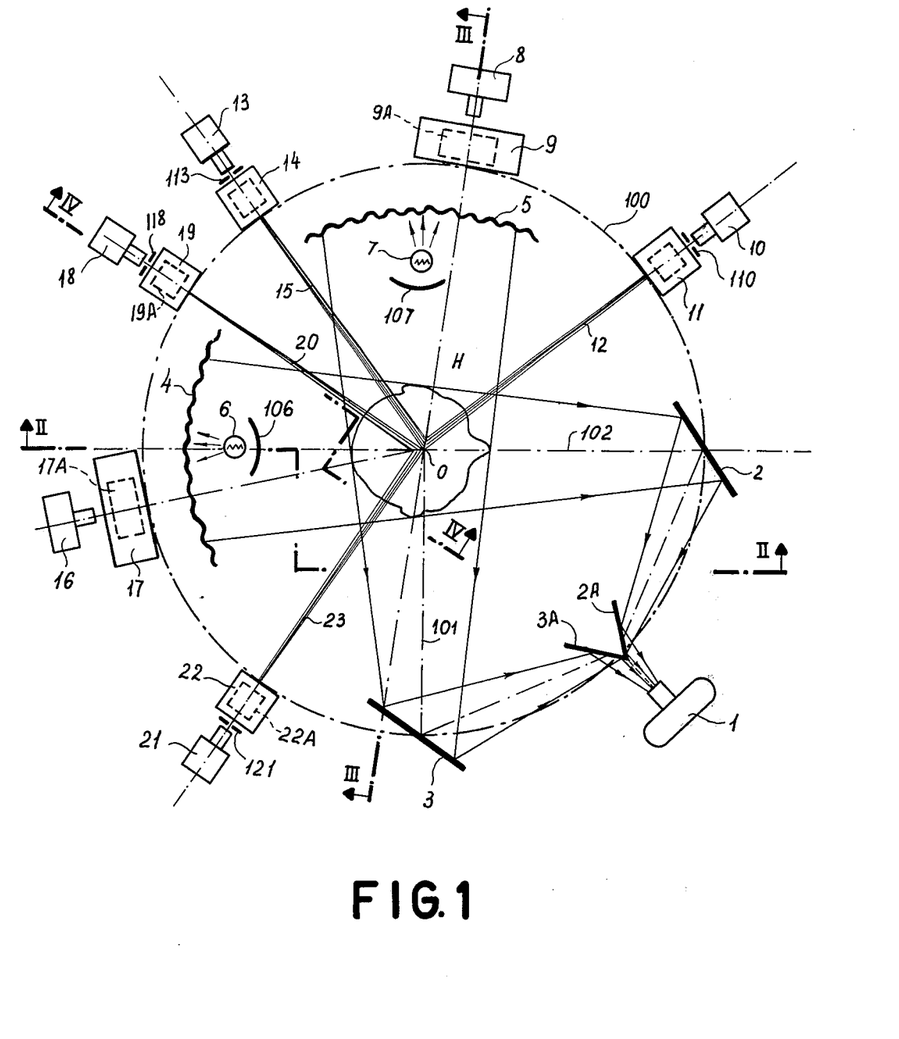
FIG. 1 is a somewhat diagrammatic top view of an apparatus for the storage of information enabling a three-dimensional representation of a solid object in accordance with my invention.

In FIG. 1 I have shown an apparatus for the storage of information to be used in the three-dimensional reproduction of a solid object, specifically a human head H. The apparatus comprises a support, such as an annular frame, schematically represented by a circular outlet 100. The support is centered on a vertical axis of rotation O passing through the top of the head H when that head is to be optically scanned for the recording of shape-related data. For this purpose the support 100 carries three peripherally spaced cameras 1, 8 and 16 whose objectives, not illustrated in detail, have horizontal optical axes trained upon the central axis of rotation O. Also mounted on the support are two pairs of light projectors 10, 13 and 18, 21 symmetrically flanking the cameras 8 and 16, respectively. The projectors of each pair lie on opposite sides of respective vertical median planes 101 and 102 intersecting orthogonally in axis O; the intersections of planes 101 and 102 with a horizontal midplane containing the optical axes of the cameras and the projectors constitute lines of sight for the viewing of silhouettes of head H.

Projectors 10 and 13 are provided with respective vertically slitted diaphragms 110 and 113 forming their outgoing light rays into flat beams 12 and 15 whose outer boundaries remote from the optical axis of camera 8 are defined by two vertical lateral planes also intersecting in axis O. Similarly, projectors 18 and 21 are provided with vertical slit diaphragms 118 and 121 forming respective flat beams 20 and 23 whose outer boundaries, as seen from the optical axis of camera 16, are also two vertical lateral planes intersecting in axis O. The beams 12, 15 and 20, 23 of each pair are substantially perpendicular to each other; adjacent beams 15 and 20 are separated by an acute angle of about 30°. The slit diaphragms will generally be disposed within the projectors themselves but have been separately illustrated for clarity's sake.

Two screens 4 and 5 of diffusedly light-reflecting character, also mounted on support 100, are arcuately curved about axis O and are respectively bisected by median planes 102 and 101. They are illuminated by respective lamps 6 and 7 which are shielded by opaque screens 106 and 107 from the central space around axis O accommodating the head H.

Figure 2:
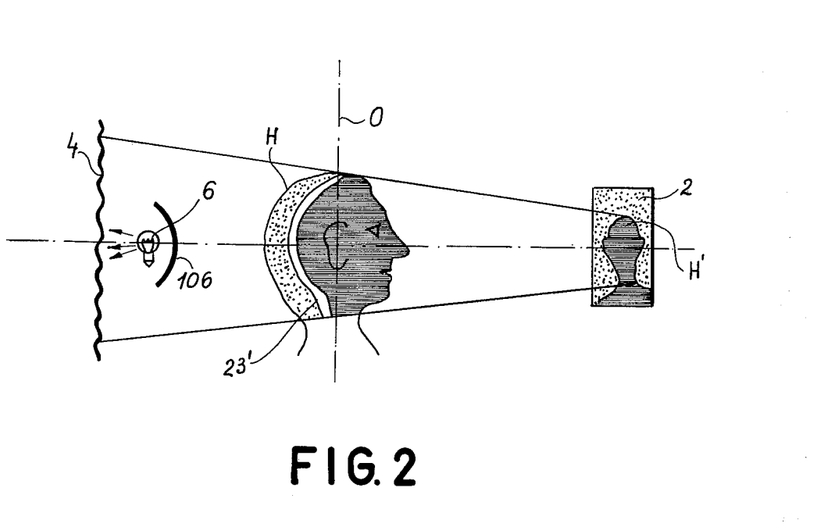
FIGS. 2, 3 and 4 are fragmentary elevational views substantially as seen along lines II—II, III—III and IV—IV, respectively, of FIG. 1.
Figure 3:
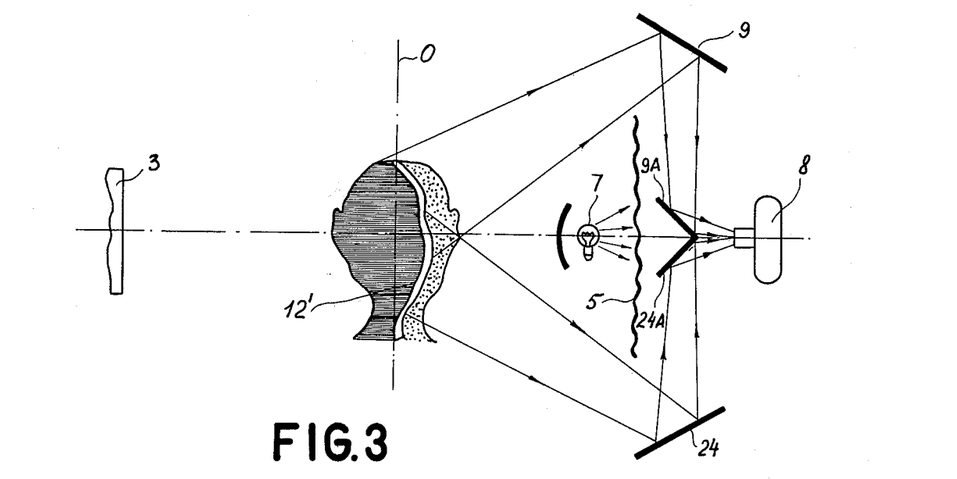

Two mirrors 2 and 3, symmetrically flanking the camera 1, are mounted on the periphery of support 100 at locations diametrically opposite screens 4 and 5, respectively. As seen from these mirrors, screens 4 and 5 extend in all directions past the outline of head H whereas screens 106 and 107 are completely hidden behind that head. The mirrors, therefore, reflect two silhouetted images H', H" (FIG. 7) of head H via an inner pair of convergent mirrors 2A and 3A toward camera 1, the image H' seen by mirror 2 being also visible in FIG. 2.

Figure 4:
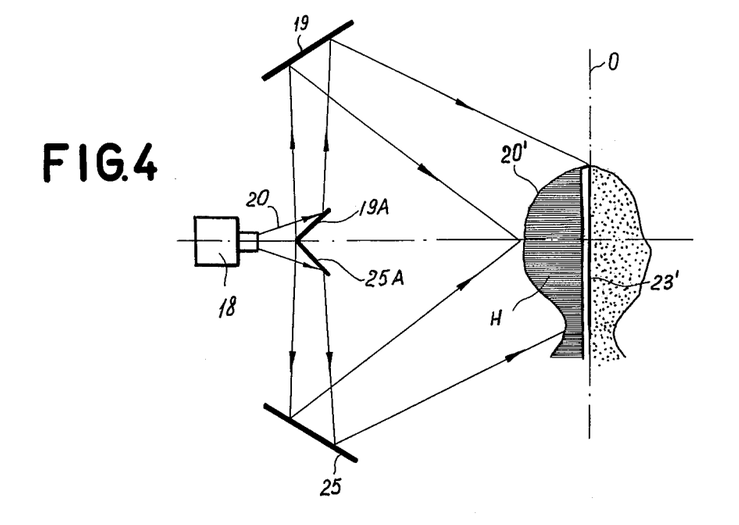
Figure 5:
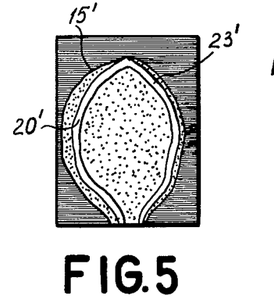
FIGS. 5, 6 and 7 show images obtained from an object optically scanned by the apparatus of FIG. 1.
Figure 6:
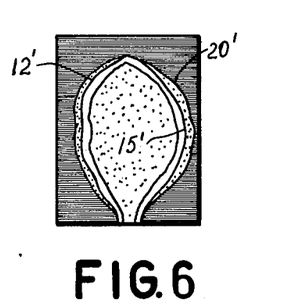

Beams 12 and 15 project upon head H a pair of narrow luminous stripes 12' and 15', seen in FIGS. 3 and 5–7, on opposite sides of median plane 101; the outer edges of these stripes constitute contour lines coplanar with axis O. Light rays from these stripes, passing above and below the screen 5, are picked up by an upper mirror 9 and a lower mirror 24 (see FIG. 3) associated with camera 8, the light being reflected by two convergent inner mirrors 9A and 24A toward the camera objective. In an analogous manner, beams 20 and 23 form stripes 15' and 23' (FIGS. 2 and 4–7) on opposite sides of median plane 102, the outer edges of these stripes again constituting contour lines coplanar with axis O. Light rays from stripes 20' and 23', passing above and below the screen 4, are picked up by an upper mirror 17 and a lower mirror (not visible) directing them via two convergent inner mirrors toward camera 16, one of the latter mirrors being indicated at 17A in FIG. 1. Thus, as shown in FIG. 5, camera 16 sees the two stripes 20' and 23' along with a trace of stripe 15'; at the same time, camera 8 sees stripes 12' and 15' along with a trace of stripe 20' as shown in FIG. 6. Camera 1 sees the silhouetted images H' and H" against the background of illuminated screens 4 and 5 as well as the stripes 12' and 23' lying within the field of view of mirrors 2 and 3, respectively.

FIG. 4 shows projector 18 as emitting its beam 20 via two divergent inner mirrors 19A and 25A toward an upper mirror 19 and a lower mirror 25 training the rays of that beam upon the head H from different directions to form the stripe 20' on an area extending all the way from the neck to the top of the head. Similarly, an upper mirror 22 and a lower mirror (not visible) coact with two divergent inner mirrors, one of them being indicated at 22A in FIG. 1, to project the stripe 23' upon an area of head H reaching from the neck to the top as likewise seen in FIG. 4.

With a sufficiently large radial distance between axis O and mirrors 2, 3, each mirror sees substantially the same outline of the head H in two diametrically opposite positions. It is therefore sufficient to rotate the support through an arc of only 90° in order to provide a full series of silhouetted images, yet with the relatively close spacing of projectors 13 and 18 shown in FIG. 1 the two pairs of beams 12, 15 and 20, 23 would not sweep the entire head unless the swing were extended to at least 150°. The beam-splitting assemblies of FIGS. 3 and 4, however, allow the light rays from the projectors to bypass the screens 4 and 5 so that all four beams could be separated by 90° to allow a complete scanning of the head with only a quarter turn of support 100.

Thus, the relative angular position of the pair of screens 4, 5 and of the set of projectors 10, 13, 18, 21 is not critical; in fact, a "lateral" plane defined by one of the beams could be made to coincide with a "median" plane of one of the screens, though this would not be practical for structural reasons. Even the angular spacing of 45° between the projectors and the associated cameras is not essential as long as the image of each stripe is picked up in a direction including an acute angle of about 30° to 60° with the plane in which that stripe is projected; their illustrated position, however, is advantageous in that it minimizes the number of mirrors required for recording the images of two stripes with one camera.

Since the stripes 12', 15' and 23' appear on a surface area of the head which also receives reflected light from screens 4 and 5, it is necessary to distinguish between these two types of illumination on the collateral images taken by cameras 8 and 16. This problem can be solved in several ways, one of them being a reduced intensity of the background illumination from lamps 6 and 7 compared with that of the projected beams 12, 15, 20 and 23. Another solution is to use light of different coloration for the lamps 6, 7 and the projectors 8, 13, 18 and 21 whereby the images of the stripes can be made to stand out with the aid of suitable light filters. Finally, it is possible to energize the lamps and the projectors at different instants and to open the shutters of cameras 8 and 16 only when the projectors are active, with camera 1 operating only during illumination of the screens.

Figure 7:
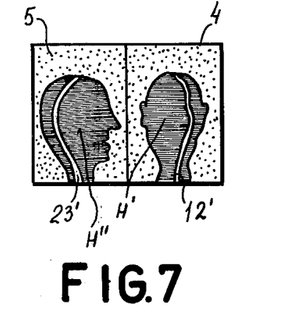

In any case, a silhouetted image as shown in FIG. 7 and two collateral images as shown in FIGS. 5 and 6 are taken in each of a multiplicity of different angular positions of support 100 relative to head H, spaced for instance 1° apart. With sufficiently short exposures, the support can be rotated continuously rather than intermittently about axis O.

For reproduction, the images taken by camera 16 (FIG. 5) may be grouped with the silhouettes H" in the left-hand half of FIG. 7. It is, of course, necessary that the positions used during scanning be closely correlated with those subsequently established in the shaping of a workpiece; thus, it may be desirable to vary the spacing of these positions throughout the scan, with an increase in density for surface areas of more intricate configuration.

Figure 8:
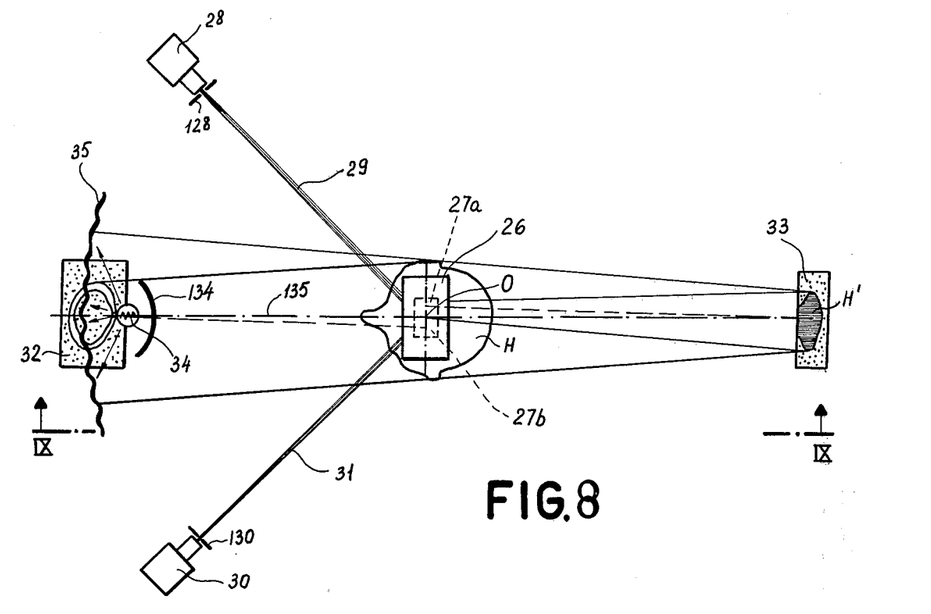
FIG. 8 is a top view of a simplified apparatus embodying my invention.
Figure 9:
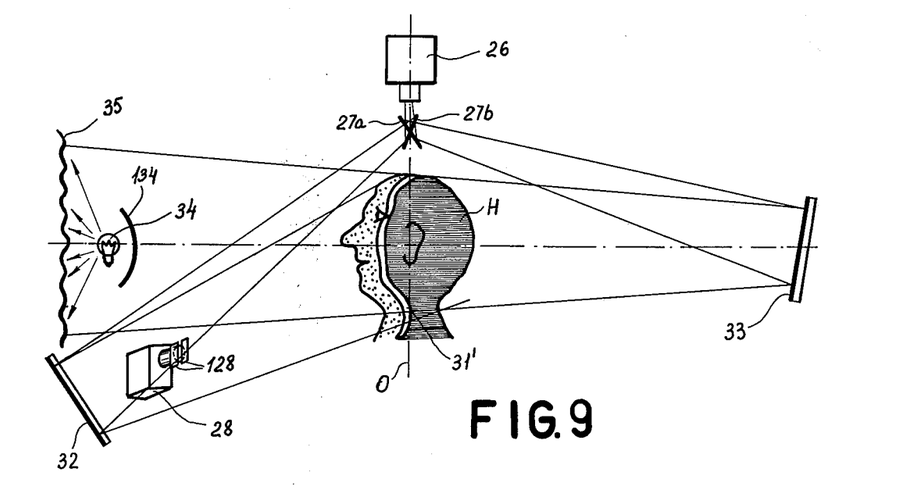
FIG. 9 is an elevational view as seen along a line VI—VI of FIG. 8.
Figure 10:
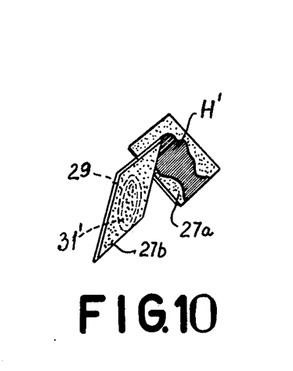
FIG. 10 is a perspective view of a pair of mirrors used in the apparatus of FIGS. 8 and 9.

In FIGS. 8-10 I have shown a simplified apparatus comprising one camera 26 disposed above the head H in line with axis O. A single reflecting screen 35, bisected by a vertical median plane 135, generates a silhouetted image H' which is picked up by a diametrically opposite mirror 33 reflecting it toward the camera via a confronting mirror 27a slightly offset from axis O. An oppositely inclined mirror 27b on the other side of that axis intercepts light rays reflected by a confronting mirror 32, disposed just below screen 35, and directs them toward camera 26. Mirrors 32 and 27b produce a collateral image showing stripes 29' and 31' formed on the head H by flat beams 29 and 31 whose outer boundaries, as seen from median plane 135, again intersect in axis O. Beams 29 and 31 are emitted by two light projectors 28 and 30 provided with vertical slit diaphragms 128 and 130, these projectors being symmetrically positioned on opposite sides of plane 135 which includes with their beams an acute angle of 45°. Screen 35 is illuminated by a lamp 34 separated by an opaque light shield 134 from the central space occupied by head H.

With the apparatus of FIGS. 8-10 the contour lines formed by stripes 29' and 31' may not extend completely to the top of the head, yet the exempted area generally does not contain any depressions which fail to show up on the silhouetted images.

Figure 11:
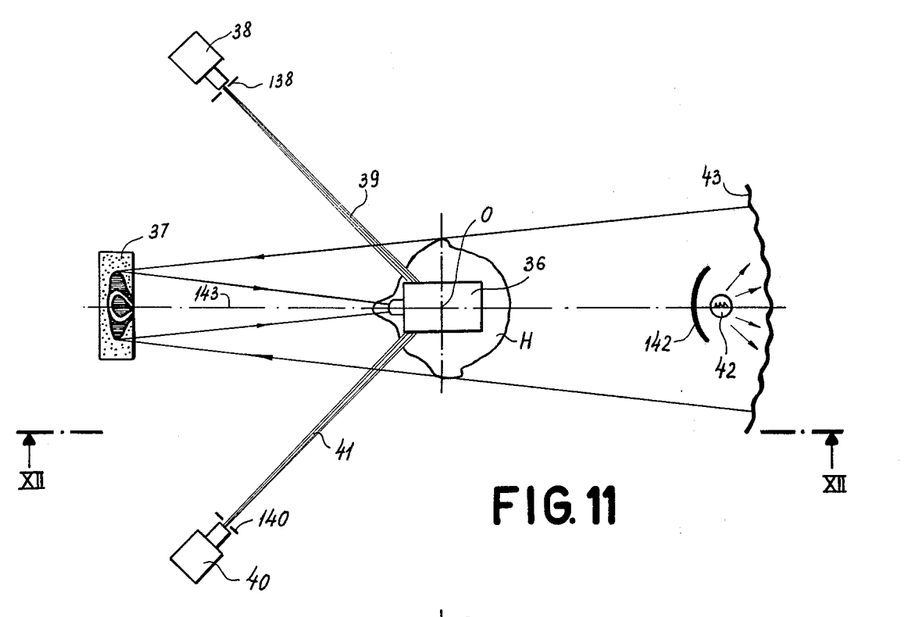
FIG. 11 is a view similar to FIG. 8 illustrating another modification.
Figure 12:
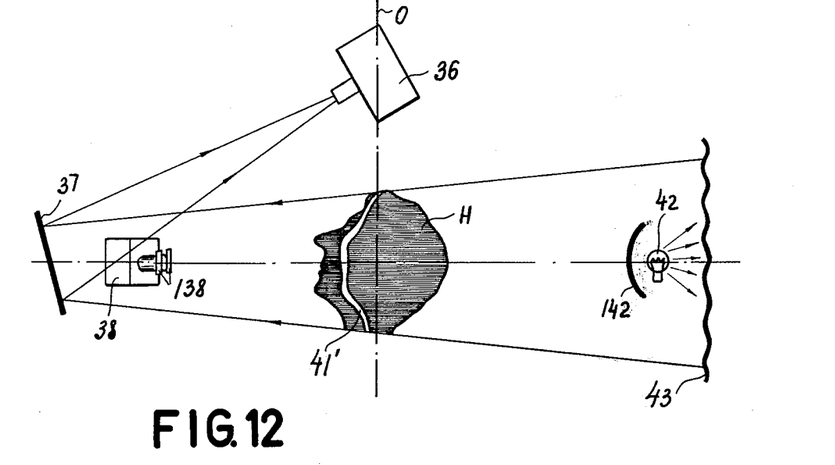
FIG. 12 is an elevational view as seen along a line XII—XII of FIG. 11.
Figure 13:
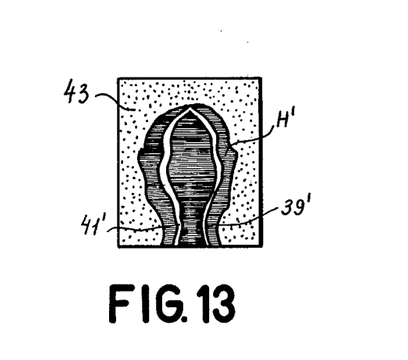
FIG. 13 shows an image obtained with the apparatus of FIGS. 11 and 12.

The apparatus of FIGS. 11-13 differs from that shown in FIGS. 8-10 in that a single mirror 37 is positioned diametrically opposite a reflecting screen 43 which is illuminated by a lamp 42 provided with a shield 142. Projectors 38 and 40, whose optical axes are horizontal and which are provided with vertical slit diaphragms 138 and 140, emit flat beams 39 and 41 again bounded by mutually orthogonal lateral planes which interset in axis O and symmetrically converge from opposite sides upon a median plane 143. Beams 39 and 41 cast two stripes 39' and 41' on the head H which are imaged together with the silhouette H' of that head by the mirror 37 reflecting their light rays toward a camera 36 above head H.

In the systems of FIGS. 8-12 the supports for the optical equipment must be rotated through 180° for a full silhouetting of the head, yet an additional 90° swing is needed if the entire head is to be scanned with contour lines from the respective beams. With additional mirrors at locations 45° from projectors 28, 30 or 38, 40, however, these projectors could be placed in diametrically opposite positions to limit the required rotation to half a turn.

With the use of a single camera, the images of the silhouettes and the stripes can be distinguished by differences in light intensity or color, as noted above, or can be stroboscopically produced at alternate times for recordal on separate film frames.

Figure 14:
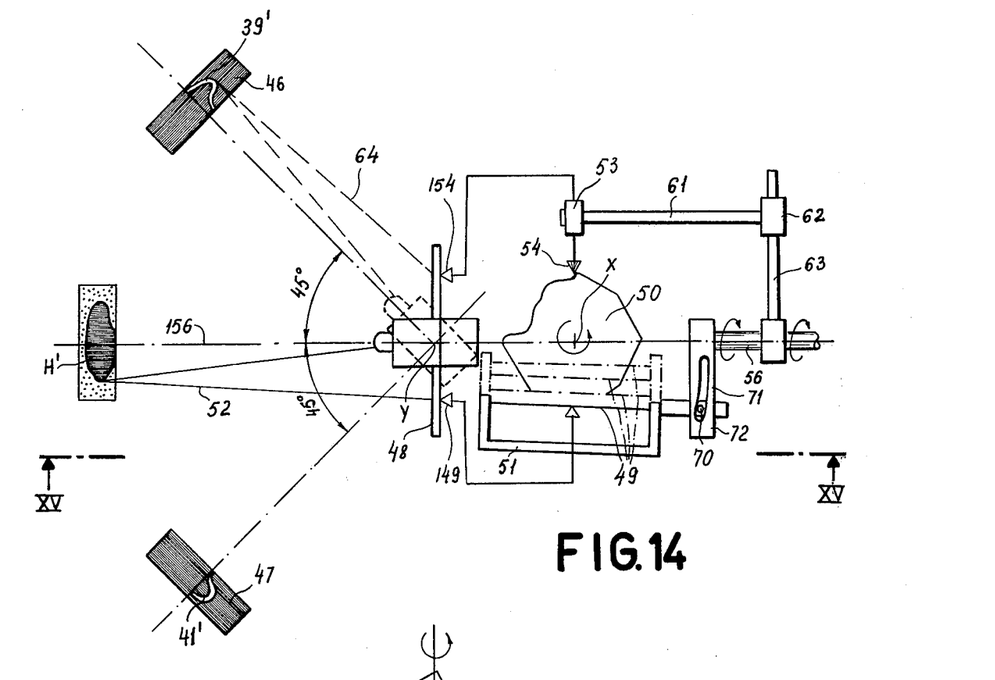
FIG. 14 is a somewhat diagrammatic top view of an apparatus for three-dimensionally reproducing of objects scanned with the apparatus of FIGS. 11 and 12.
Figure 15:
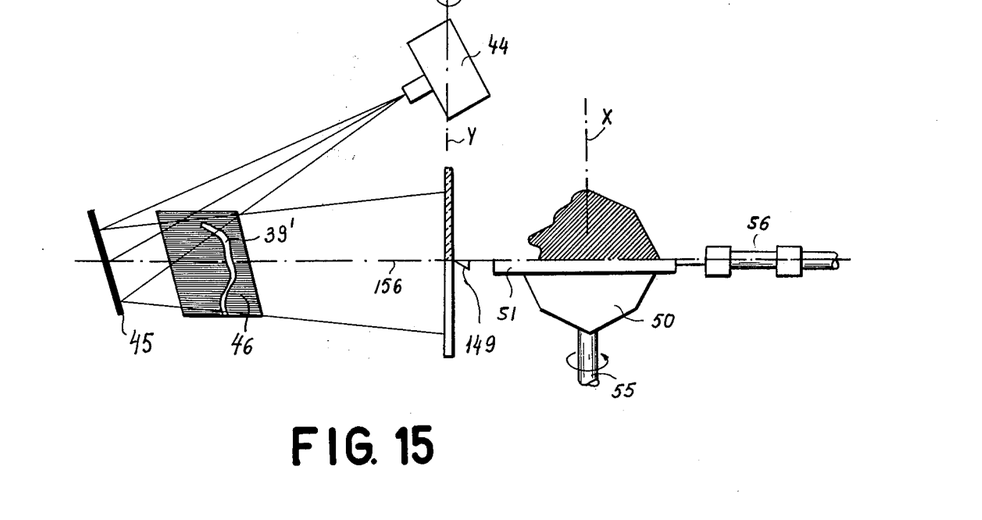
FIG. 15 is a fractional elevational view, partly in section, substantially as seen on a line XV—XV of FIG. 14.

In FIGS. 14 and 15 I have shown an apparatus for reproducing an object such as head H from the data obtained by the optical scanning of that object, specifically in this instance by the apparatus of FIGS. 11 and 12. A blank or workpiece 50, such as a block of metal or other mechinable material, is mounted on a support rotatable about an axis X, this support being here simply represented by a vertical shaft 55. A projector 44 is swivelable about an axis Y parallel to axis X between a median position, illustrated in full lines, and two lateral positions offset therefrom by ±45°, one of them having been indicated in phantom lines. In its median position, projector 44 receives a series of silhouetted images H' copied out from the composite image shown in FIG. 13. In the phantom-line position, projector 44 receives a series of images of stripe 39' taken from the right-hand half of the composite image of FIG. 13. In its third position, symmetrical to the previous one, it receives images of stripe 41' taken from the left-hand half of the composite of FIG. 13. The carriers of these images could be slides or frames of a cinematographic film.

Three stationary mirrors 45, 46 and 47, respectively in line with the optical axis of the projector in its three working positions, reflect the corresponding images upon a stationary ground-glass plate 48 which includes the axis Y and is perpendicular to a vertical median plane defined by axes X, Y. The image thus projected serves for the respective guidance of two tool holders, namely a frame 51 and a high-speed motor 53, according to the outlet of silhouetted H' and the contour line of stripe 39' or 41'. Photoelectric scanners for tracing a line on a surface such as a ground-glass plate or, possibly, a television screen and for controlling the motion of a follower are well known. In the present instance, these scanners have been represented only diagrammatically at 149 and 154. It will be understood, moreover, that tracers linked with the aforementioned tool holders could also be manually displaced along these lines for the guidance of the associated carving tools.

Tool holders 51 and 53 are carried on a shaft 56 which is rotatable through about 300° and has a horizontal centerline 156, perpendicular to axes X, Y, in line with mirror 45. The first tool, mounted on frame 51, is a hot cutting wire 49 extending along a line which intersects the centerline 156 at a remote pivotal point whose distance from axis X substantially corresponds to the optical distance of axis O from the image plane of camera 36 of FIGS. 11 and 12. Frame 51 carries a pin 70 received in an arcuate slot 71 of an arm 72 which is rigid with shaft 56, slot 71 being curved about the aforementioned pivotal point represented in FIG. 17 by a fulcrum 65 of a swing arm 73 whereby frame 51 is constrained to maintain the wire 49 aligned with that point. Several alternate positions of wire 49, corresponding to different positions of line scanner 149, have been indicated in phantom lines in FIG. 14; each such position coincides with a working line skew to axis X.

Figure 16:
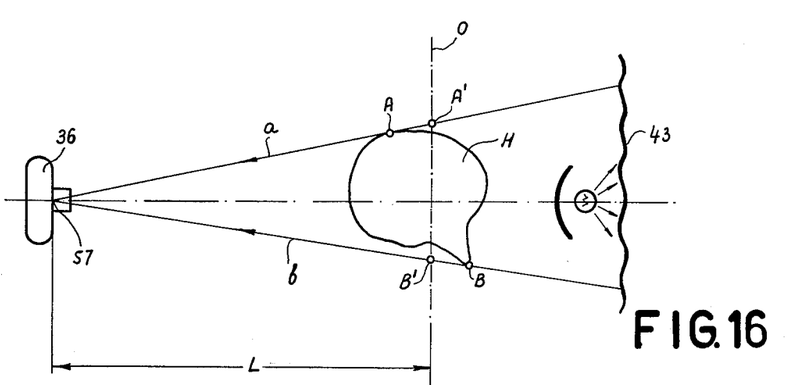
FIGS. 16 and 17 are diagrammatic plan and perspective views illustrating the correlation between the taking of a silhouetted image with an apparatus according to FIG. 1, 8 or 11 and the utilization of that image in the shaping of a blank by an apparatus as shown in FIGS. 14 and 15.
Figure 17:
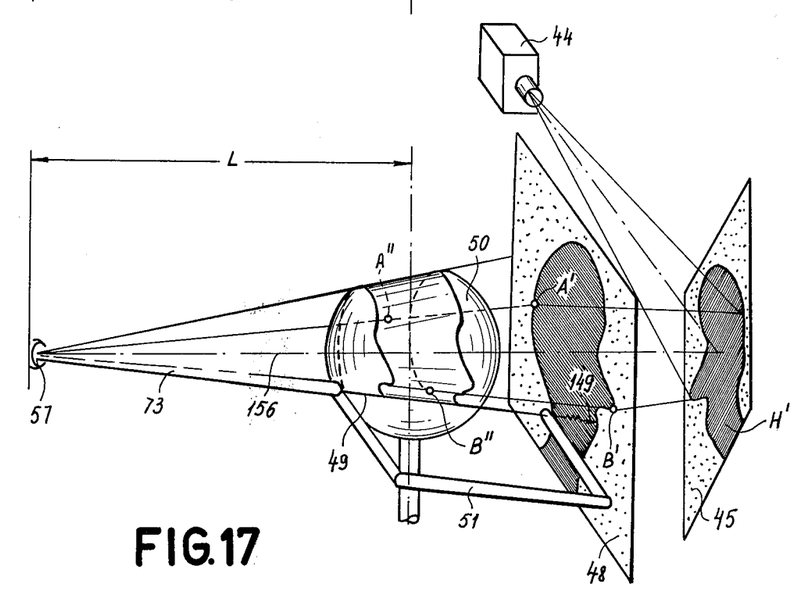

The distance L between fulcrum 65 and axis X in FIG. 17 is the same as the distance between axis O and the focal point of camera 36 (substantially coinciding with its image plane) which has been indicated at 57 in FIG. 16 where the camera is schematically shown in line with head H and screen 43. Two marginal rays a and b from the illuminated screen, converging at focal point 57, are tangent to the head H at respective points A and B. If the camera were considered as replaced by a projector, with a ground-glass plate in the position of axis O, the rays would intersect that plate at two points A' and B'. Since it is not practical to place the ground-glass plate 48 of FIGS. 14 and 15 in the vertical plane containing the axis X, the length of the light path from projector 44 via mirror 45 to plate 48 must be so chosen that the spacing of the image points A' and B' from centerline 156 slightly exceeds the theoretical distance of these points from the optical axis of camera 36. As will be apparent from FIGS. 16 and 17, wire 49 will cut the block 50 along lines including points A" and B" whose positions correspond to those of points A and B in FIG. 16 when the line scanner 151 registers with image points A' and B40, respectively. Scanner 149 responds to light rays 52 (FIG. 14) marking the outlet of the silhouetted image H'. Cutting wire 49 could be replaced by some other straight-edged tool, e.g. an elongate cylindrical mill of small diameter.

The second tool is a tapered cutting head such as an end mill 54 driven by motor 53 which is radially movable in a transverse working plane passing through axis X. Motor 53 is mounted on an arm 61 that is rigid with a sleeve 62 on a rod 63 extending radially from shaft 56. The radial distance of the tip of tool 54 from centerline 156 is the same as that of scanner 154 tracking the outer edge of stripe image 39' or 41' formed by rays such as the one shown at 64.

It should be noted that images of stripes 39' and 41', serving for the radial guidance of mill 54 while projector 44 illuminates mirror 46 or 47, are not taken in the same angular position of the rotary support for the equipment of FIGS. 11 and 12 as is the silhouetted image H' controlling the displacement of toll 49. Instead, the position of that support represented by the collateral images of the stripes, as used in a given angular position of workpiece 50, is offset by 45° from the rotary-support position giving rise to the image H' utilized in the same angular workpiece position. To this end it is, of course, necessary to rearrange the sequence of the images copied from the constituents of successive composite images (FIG. 13) before feeding them to projector 44. Such transposition would not be required if the system of FIGS. 11 and 12 were modified in the aforedescribed manner to let the beams 39 and 41 impinge upon the head H from diametrically opposite directions, with their boundaries lying in a common vertical plane passing through axis O at right angles to plane 135. In any event, tools 49 and 51 will operate at different times while the block 50 is being held in a certain angular position.

The apparatus of FIGS. 14 and 15 can be readily adapted to the handling of images produced by the equipment of FIG. 1 or FIG. 8. Furthermore, the magnification ratio of the images projected onto ground-glass plate 48 may be changed to provide a reproduction on a scale other than 1:1, if desired.

I claim:

1. A method of storing information enabling a three-dimensional representation of a solid object, comprising the steps of:
    (a) positioning the object in front of an illuminated background area substantially paralleling an axis passing through said object;
    (b) taking a silhouetted image of said object against said background area in a direction generally perpendicular thereto;
    (c) illuminating said object, in the position of steps (a) and (b), with at least one flat light beam trained upon the object along a plane including said axis whereby a contour line is projected upon the surface of the object;
    (d) taking a collateral image of said object showing said contour line at an acute angle to said plane;
    (e) repeating steps (a), (b) and (c) in a multiplicity of different angular positions, centered on said axis, of said object relative to said background area and said plane; and
    (f) recording the information conveyed by said silhouetted image and said collateral image in each of said angular positions.

2. A method as defined in claim 1 wherein two flat light beams are trained in step (c) upon the object along a pair of planes intersecting in said axis whereby two contour lines are projected upon the object surface, a collateral image of each of said contour lines being taken in step (d).

3. A method as defined in claim 2 wherein said planes are substantially orthogonal to each other.

4. A method as defined in claim 1, 2 or 3 wherein the recording in step (f) is carried out photographically.

5. A method as defined in claim 4 wherein said silhouetted image and said collateral image are recorded with different degrees of luminosity on a common photographic medium.

6. A method as defined in claim 4 wherein said silhouetted image and said collateral image are recorded with different coloration on a common photographic medium.

7. An apparatus for use in the three-dimensional representation of a solid object, comprising:

support means rotatable about an axis, said support means surrounding a central space including said axis accommodating an object to be three-dimensionally reproduced;

light-reflecting screen means on said support means defining a background area projecting beyond the outline of said object as viewed from a diametrically opposite location on said support means;

first light-emitting means on said support means shielded from said central space and trained upon said screen means for illuminating same to the exclusion of said object;

second light-emitting means on said support means directing at least one flat light beam toward said central space in a plane including said axis whereby a contour line is projected upon the surface of said object; and light-guiding means on said support means including at least one camera objective mounted for exposing a recording medium to a silhouetted image of said object, taken at said diametrically opposite location against said background area, and a collateral image of said contour line, taken at an acute angle to said plane.

8. An apparatus as defined in claim 7 wherein said second light-emitting means comprises a pair of projectors, with diaphragms having slits parallel to said axis, emitting two flat light beams toward said central space in a pair of lateral planes intersecting in said axis and giving rise to two contour lines on said surface.

9. An apparatus as defined in claim 8 wherein said screen means comprises two screens arcuately curved about said axis and bisected by respective median planes substantially perpendicular to each other, each of said median planes being flanked by a respective pair of projectors forming part of said second light-emitting means.

10. An apparatus as defined in claim 7, 8 or 9 wherein said light-guiding means comprises at least one mirror positioned to reflect light rays from said background area and said surface.

11. An apparatus as defined in claim 10 wherein said camera objective is disposed in line with said axis in the path of the reflected light rays.

12. An apparatus as defined in claim 8 or 9 wherein said light-guiding means comprises two mirror pairs associated with each of said projectors for reflecting light rays from the associated projector within the respective lateral plane from different directions upon said surface area.

13. An apparatus for use in the three-dimensional representation of a solid object, comprising:

support means rotatable about an axis and adapted to hold a workpiece to be shaped into a replica of an object to be three-dimensionally reproduced;

a first tool holder adjacent said support means defining an operating line for a cutting edge skew to said axis, said operating line being tiltable about a fulcrum remote from said axis;

a second tool holder adjacent said support means defining a working plane including said axis for a cutting head pointed toward said axis; and control means for the guidance of said first tool holder according to first positional information and for the guidance of said second tool holder according to second positional information in each of a multiplicity of angular positions of said support means, said first positional information being a record of a corresponding multiplicity of silhouetted images of said object successively taken at different angles, said second positional information being a record of a corresponding multiplicity of collateral images of contour lines projected upon said object from different angles.

14. An apparatus as defined in claim 13 wherein said control means comprises an image projector orientable in a first position relative to said axis for displaying said silhouetted images and in a second position relative to said axis for displaying said collateral images.

15. An apparatus as defined in claim 14 wherein said control means further comprises a ground-glass plate and mirror means for reflecting light rays from said projector in both said first and second positions upon said ground-glass plate.

* * * * *